United States Patent
Kinsella

(10) Patent No.: US 7,675,354 B2
(45) Date of Patent: Mar. 9, 2010

(54) SWITCHING CIRCUIT FOR SWITCHABLY CONNECTING AN INPUT NODE AND AN OUTPUT NODE

(75) Inventor: Barry Peter Kinsella, Listowel (IE)

(73) Assignee: Analog Devices, Inc., Norwood, MA (US)

( * ) Notice: Subject to any disclaimer, the term of this patent is extended or adjusted under 35 U.S.C. 154(b) by 19 days.

(21) Appl. No.: 11/985,926

(22) Filed: Nov. 19, 2007

(65) Prior Publication Data

US 2009/0128217 A1    May 21, 2009

(51) Int. Cl.
*G05F 3/02* (2006.01)

(52) U.S. Cl. .................. 327/540; 327/541; 327/543

(58) Field of Classification Search .......... 327/540, 327/541, 543
See application file for complete search history.

(56) References Cited

U.S. PATENT DOCUMENTS

| | | | | |
|---|---|---|---|---|
| 5,047,657 A | * | 9/1991 | Seevinck et al. | 327/306 |
| 5,592,072 A | * | 1/1997 | Brown | 323/268 |
| 6,114,897 A | | 9/2000 | Ham | |
| 6,147,520 A | * | 11/2000 | Kothandaraman et al. | 327/77 |
| 6,236,259 B1 | | 5/2001 | Goodell et al. | |
| 6,278,320 B1 | * | 8/2001 | Vu | 327/539 |
| 6,366,068 B1 | * | 4/2002 | Morishita | 323/282 |
| 6,646,463 B1 | * | 11/2003 | Hariton | 326/30 |
| 2003/0156439 A1 | | 8/2003 | Ohmichi et al. | |
| 2004/0196089 A1 | | 10/2004 | O'Donnell et al. | |

FOREIGN PATENT DOCUMENTS

| | | |
|---|---|---|
| JP | 58-171126 | 10/1983 |
| WO | WO 02/13386 | 2/2002 |

OTHER PUBLICATIONS

PCT/EP2008/065846, International Search Report and Written Opinion, Feb. 4, 2009.

* cited by examiner

*Primary Examiner*—Kenneth B. Wells
(74) *Attorney, Agent, or Firm*—Kenyon & Kenyon LLP

(57) ABSTRACT

The application provides a switching circuit for switchably connecting an input node and an output node. The switching circuit comprises a switch operable to switchably connect the input node to the output node in response to a switching signal. A sensor is provided for sensing the voltage between the input and output nodes and providing a sense signal in response thereto. A driver coupled to the sensor adjusts the switching signal in response to the sense signal.

17 Claims, 5 Drawing Sheets

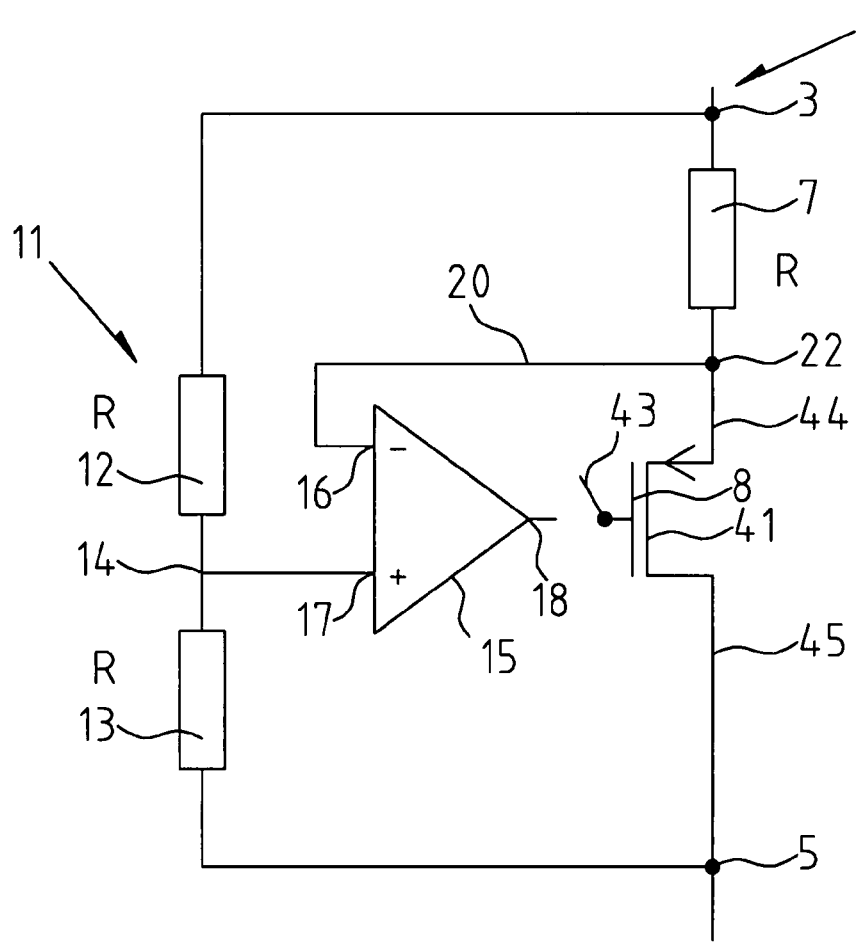
Fig. 5
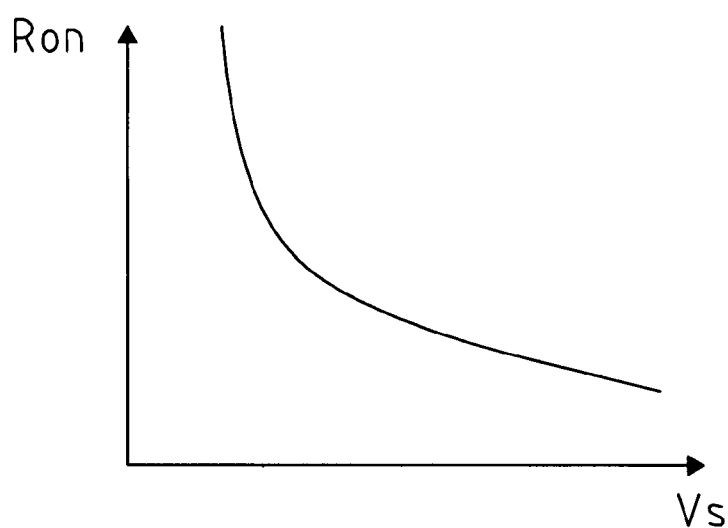
PRIOR ART      Fig. 6

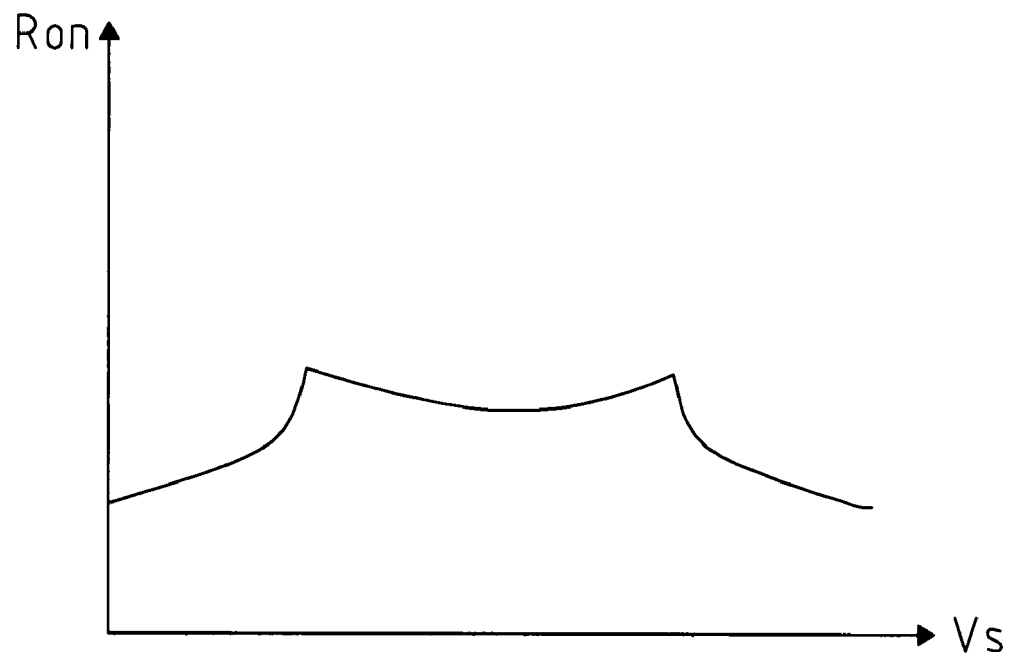
PRIOR ART  Fig. 9
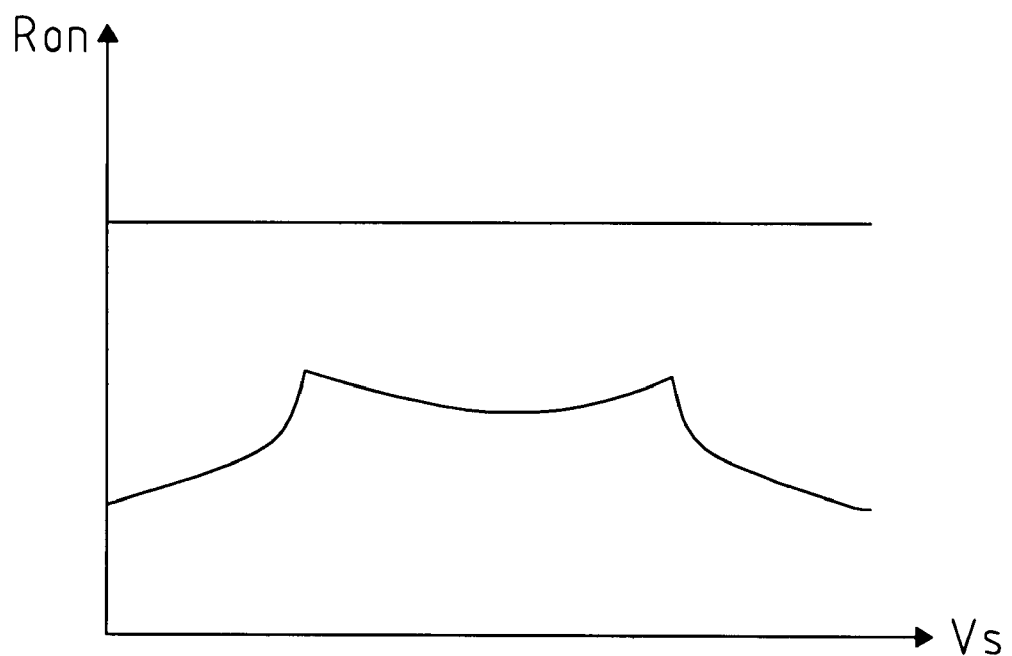
Fig. 10

SWITCHING CIRCUIT FOR SWITCHABLY CONNECTING AN INPUT NODE AND AN OUTPUT NODE

FIELD OF THE APPLICATION

The present application relates to a switching circuit. The present application more particularly relates to a switching circuit configured such that in use its on-resistance remains substantially constant.

BACKGROUND

Switches are well known in the art of circuit design. The most common types of switches used in circuit design are the NMOS switch, the PMOS switch, and the CMOS switch. The on-resistance ($R_{on}$) of switches is known to vary. This variation in on-resistance in turn leads to distortion on the signal as it passes through the switch. To minimise $R_{on}$ variations, the gates of NMOS switches are usually biased to be at the highest available voltage, typically, $V_{DD}$. FIG. 2 shows a typical $R_{on}$ plot for a prior art NMOS switch in the on state, with $R_{on}$ plotted against the signal voltage of the NMOS switch. As the signal voltage approaches $V_{DD}$ the $R_{on}$ becomes so high that the signal on the output of the switch no longer follows the input and instead starts to be clamped.

In contrast, in PMOS switches the gate is usually biased to be at the lowest available voltage, typically ground, to minimise $R_{on}$ variations. FIG. 6 shows a typical $R_{on}$ plot for a prior art PMOS switch in the on state. $R_{on}$ is plotted against the signal voltage of the PMOS switch. As the signal voltage approaches ground, $R_{on}$ becomes so high that the signal on the output of the switch no longer follows the input and instead starts to be clamped, which results in distortion of the signal as it passes through the switch.

A CMOS switch comprises an NMOS transistor coupled in parallel to a PMOS transistor, thus advantageously combining the characteristics of NMOS and PMOS devices. Although the $R_{on}$ characteristic is improved over the $R_{on}$ of an NMOS switch or the PMOS, $R_{on}$ still displays significant variation, as illustrated in FIG. 9. This variation in resistance results in distortion of the signal passing through the switch.

SUMMARY

These and other problems are addressed by provision of a switching circuit configured to provide a substantially constant on-resistance. Such a circuit may be implemented using a switch operable for switchably connecting an input to an output in response to a switching signal provided by a driver. A sensor provides a sense signal, and the driver adjusts the switching signal in response to the sense signal.

The sensor may typically be implemented using a resistor divider, and the driver may be typically implemented using an operational amplifier.

These and other features will be better understood with reference to the followings Figures which are provided to assist in an understanding of the teaching of the invention.

BRIEF DESCRIPTION OF THE DRAWINGS

The present application will now be described with reference to the accompanying drawings in which:

FIG. 5 is a schematic circuit diagram of a switching circuit according to another embodiment, FIG. 6 is a graph illustrating $R_{on}$ variations of a prior art PMOS switch in the on state, FIG. 9 is a graph illustrating $R_{on}$ variations of a prior art CMOS switch in the on state, and FIG. 10 is a graph illustrating the improved $R_{on}$ performance of the switching circuit of FIG. 4 compared with the prior art CMOS switch.

DETAILED DESCRIPTION OF THE DRAWINGS

The invention will now be described with reference to exemplary circuits thereof which are provided to assist in an understanding of the teaching of the invention.

Figure 1:
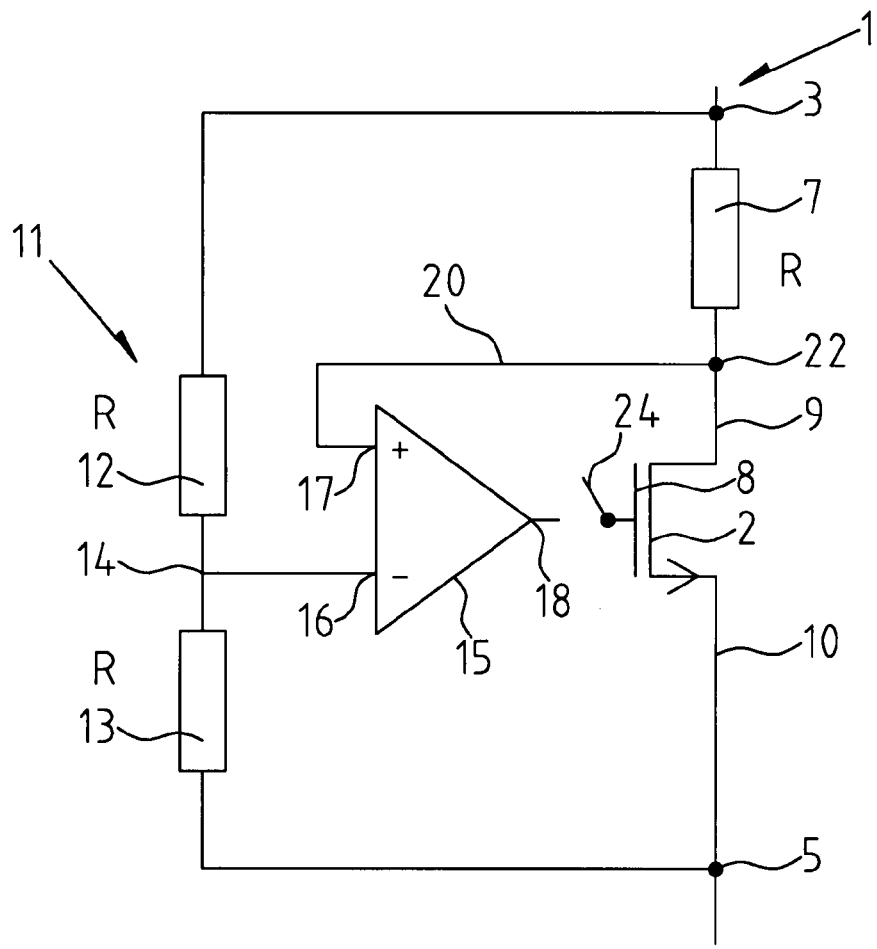
FIG. 1 is a schematic circuit diagram of a switching circuit according to a first embodiment.
Figure 2:
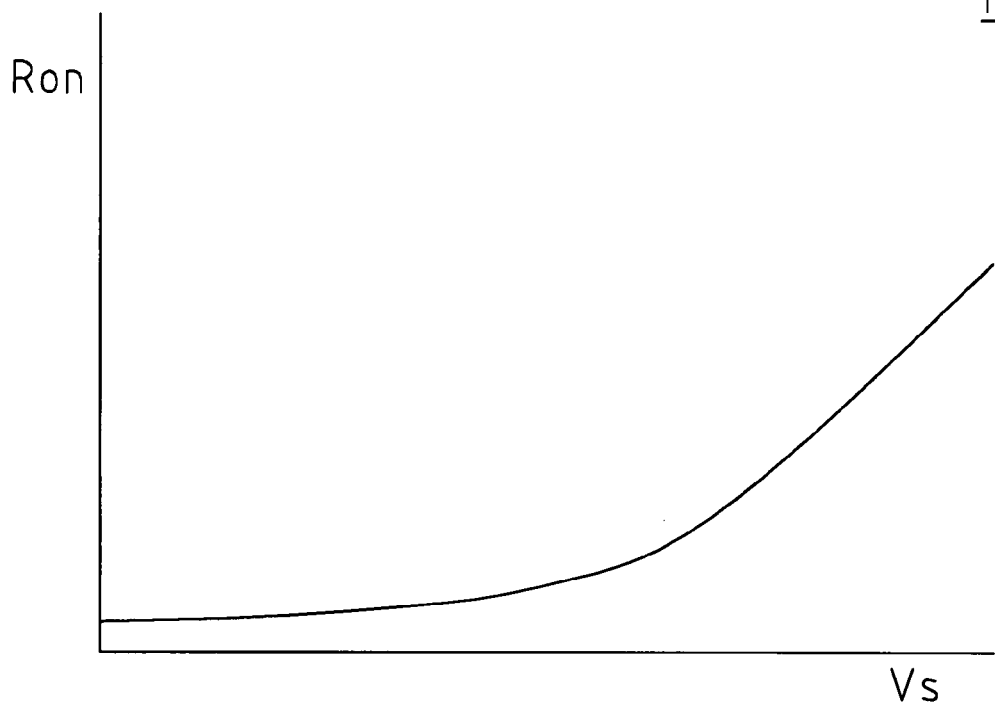
FIG. 2 is a graph illustrating $R_{on}$ variations of a prior art NMOS switch in the on state.

Referring to the drawings and initially to FIG. 1, there is provided a switching circuit 1 comprising an NMOS transistor 2 for switchably connecting an input node 3 to an output node 5. The NMOS transistor 2 is coupled in series with a sense element, suitably a resistor 7, between the input node 3 and the output node 5. The NMOS transistor 2 comprises a gate 8, a drain 9, and a source 10. The sense resistor 7 is connected to the input node 3 at one end and the drain 9 at the other end. The source 10 is coupled to the output node 5.

A resistor divider potentiometer 11 is provided as a sensor comprising a first resistor 12 and a second resistor 13 coupled between the input node 3 and the output node 5. The first resistor 12 and the second resistor 13 are of equal resistance. The intermediate node 14 common to the first resistor 12 and the second resistor 13 provides a sense output voltage corresponding to a voltage level midway between the input node 3 and the output node 5 as, in the example shown, both the first resistor 12 and the second resistor 13 are of equal resistance.

$$V_{sense} = V_0 + (V_{in} - V_0)/2 \quad (1)$$

A driver, for example an operational amplifier 15, is used to provide a drive signal to the gate of the NMOS transistor 2. The operational amplifier 15 has a non-inverting terminal 17 and an inverting terminal 16. The drive signal for driving the gate 8 of the NMOS transistor 2 is provided by the output 18 of the amplifier 15. The intermediate node 14 of the resistor divider 11 is coupled to the inverting terminal 16 of the op-amp 15. A feedback path 20 couples the non-inverting terminal 17 of the op-amp 15 to a third node 22 common to the drain 9 of the NMOS transistor 2 and the sense resistor 7. In this arrangement, the op-amp 15 operates to ensure that the voltage at the third node 22 is maintained equal to the voltage at the intermediate node 14 on the resistor divider 11. The voltage at the intermediate node 14 is midway between the voltage at the input node 3 and the output node 5. As a consequence $R_{on}$ of the NMOS transistor 2 is forced to equal that of the sense resistor 7 so that the voltage at node 22 is the same as the voltage at node 14. The op-amp 15 varies the gate voltage of the NMOS transistor 2 so that the voltage at the third node 22 is maintained equal to that of the voltage on the intermediate node 14. As a result of this, the $R_{on}$ of the NMOS transistor 2 is maintained constant i.e., equal to that of the sense resistor 7. A first control switch 24 is provided between the output 18 of the op-amp 15 and the gate 8 of the NMOS transistor 2 for selectively removing the drive signal from the gate and thus turning off the NMOS transistor 2. Suitably, the first control switch 24 is switchable between the output 18 for turning on the NMOS transistor 2 and a voltage source suitable for turning off the NMOS transistor 2, in this case, ground.

As the resistance values of the resistors in the resistor divider 11 are selected to be significantly higher than the resistance value of the sense resistor 7, the effective total resistance ($R_{on}$) between the input node 3 and the output node 5 of the switching circuit 1 may be taken as the drain-source resistance of the NMOS transistor 2 plus the resistance of the sense resistor 7. Therefore, since the operational amplifier 15 maintains the drain-source resistance equal to that of the sense resistor 7, the $R_{on}$ for the switching circuit 1 is maintained constant at twice the resistance of the sense resistor 7.

Figure 3:
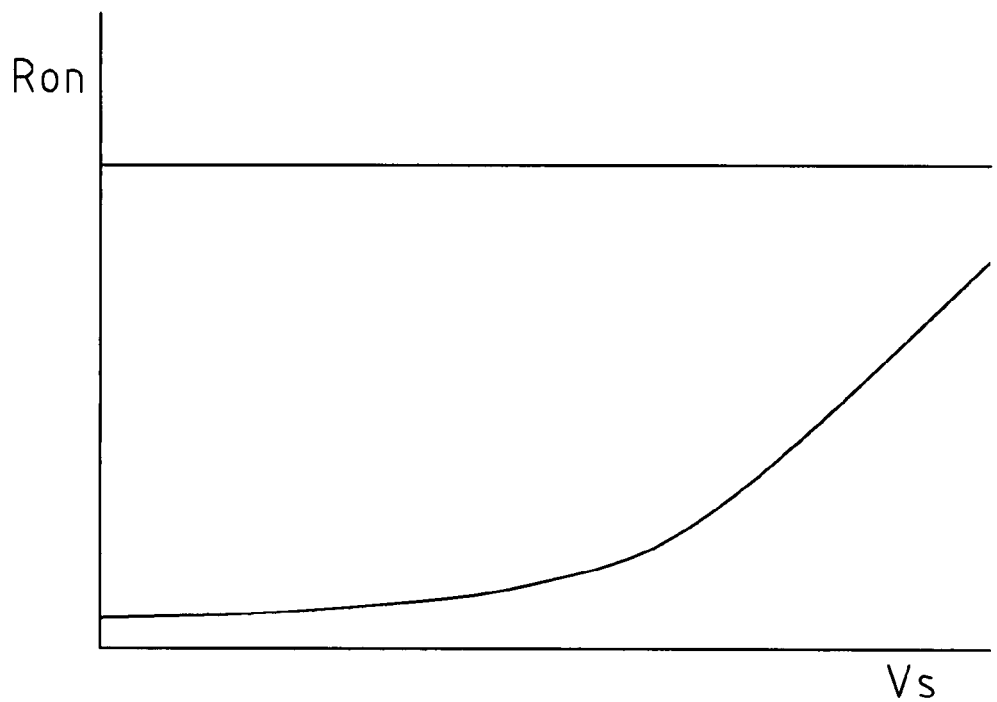
FIG. 3 is a graph illustrating the improved $R_{on}$ performance of the switching circuit of FIG. 1 compared with the prior art NMOS switch.

The graph of FIG. 3 shows the improved performance of the switching circuit 1 compared to the prior art NMOS switch. The $R_{on}$ of the switching circuit 1 remains constant at twice the resistance of the sense resistor 7.

In operation, the resistor divider 11 provides an output sense voltage at the intermediate node 14 to be a value mid way between the voltages at the input node 3 and the output node 5. The op-amp 15 adjusts the voltage at the third node 22 to be equal to the voltage at the intermediate node 14 which forces the $R_{on}$ of the NMOS transistor 2 to be equal to the resistance of sense resistor 7. Thus, the $R_{on}$ of the NMOS transistor 2 is forced to equal that of the sense resistor 7, and the total $R_{on}$ for the switching circuit 1 will be twice the value of the sense resistor 7. As the total $R_{on}$ for the switching circuit 1 remains substantially constant, the output of the switching circuit 1 will substantially follow the input thereby significantly reducing output distortion that, as described above, occurs in switches due to $R_{on}$ variations.

Figure 4:
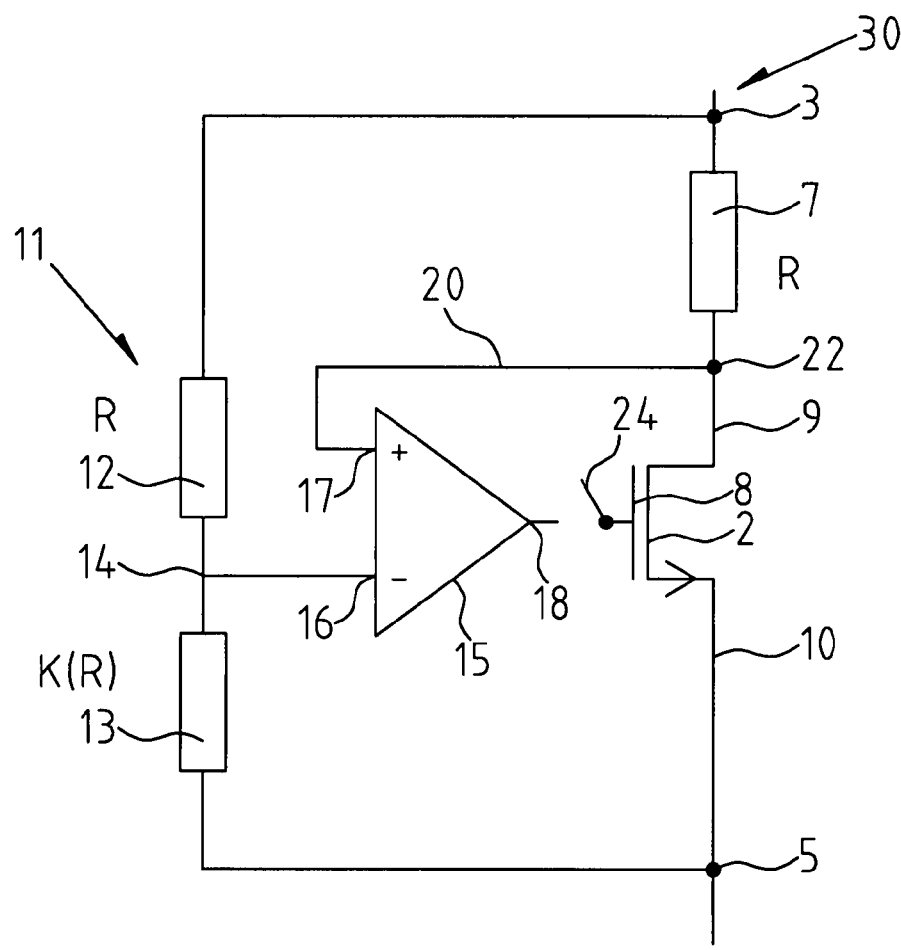
FIG. 4 is a schematic circuit diagram of a switching circuit according to another embodiment.

Referring now to FIG. 4, there is illustrated another exemplary switching circuit 30 which is substantially similar to the switching circuit 1 and like components are indicated by the same reference numerals. In the arrangement shown, the second resistor 13 of the resistor divider 11 is a different resistance than the first resistor 12. Instead, the resistance of the second resistor 13 is a constant (K) times the first resistor 12. By arranging the resistance of the resistor divider 12 in this manner, the on-resistance of the NMOS transistor 2 is K times the resistance of the sense resistor 7 in order for the voltage at the third node 22 to be equal that of the intermediate node 14. For example, if the second resistor 13 has a resistance which is twice that of the first resistor 12, the voltage at the intermediate node 14 is a third of the voltage across the input node 3 and the output node 5.

$$V_{sense}=(K \cdot V_i+V_0)/(K+1) \tag{2}$$

For K=2 (3)

$$V_{sense}=(2 \cdot V_i+V_0)/3 \tag{4}$$

In order for the voltage at node 22 to be maintained the same as the voltage at the intermediate node 14, the $R_{on}$ of the NMOS transistor 2 must be forced to be twice the size of the sense resistor 7. The op-amp 15 drives the gate 8 of the NMOS transistor 2 so that $R_{on}$ of the NMOS transistor 2 is twice the resistance of the sense resistor 7. As a result, it will be appreciated that the effective $R_{on}$ between the input and output nodes of the switching circuit 30 will be three times the resistance of the sense resistor 7. As the total $R_{on}$ for the switching circuit 30 remains substantially constant, the output of the switching circuit 30 will substantially follow the input thereby substantially eliminating output distortion that typically occurs in switches due to $R_{on}$ variations. The operation of the switching circuit 30 is substantially similar to the switching circuit 1.

Referring now to FIG. 5, there is illustrated another switching circuit 40 which is substantially similar to the switching circuit 1 and like components are indicated by the same reference numerals. The difference between the switching circuit 40 arid the switching circuit 1 is that, instead of providing the switch as an NMOS transistor 2, it is provided as PMOS transistor 41. Furthermore, the first control switch 24 is replaced by a second control switch 43 which is selectable between the output 18 of the op-amp 15 for turning on the PMOS transistor 41 and a voltage source suitable for turning off the PMOS transistor 41, in this ease $V_{DD}$. The intermediate node 14 on the resistor divider 11 is coupled to the non-inverting terminal 17 of the op-amp 15, and the feedback path 20 couples the inverting terminal 16 of the op-amp 15 to the third node 22. The source 44 of the PMOS transistor 41 is also coupled to the third node 22, and the drain 45 is coupled to the output node 5. Otherwise, the operation of the switching circuit 40 is substantially similar to the operation of the switching circuit 1.

Figure 7:
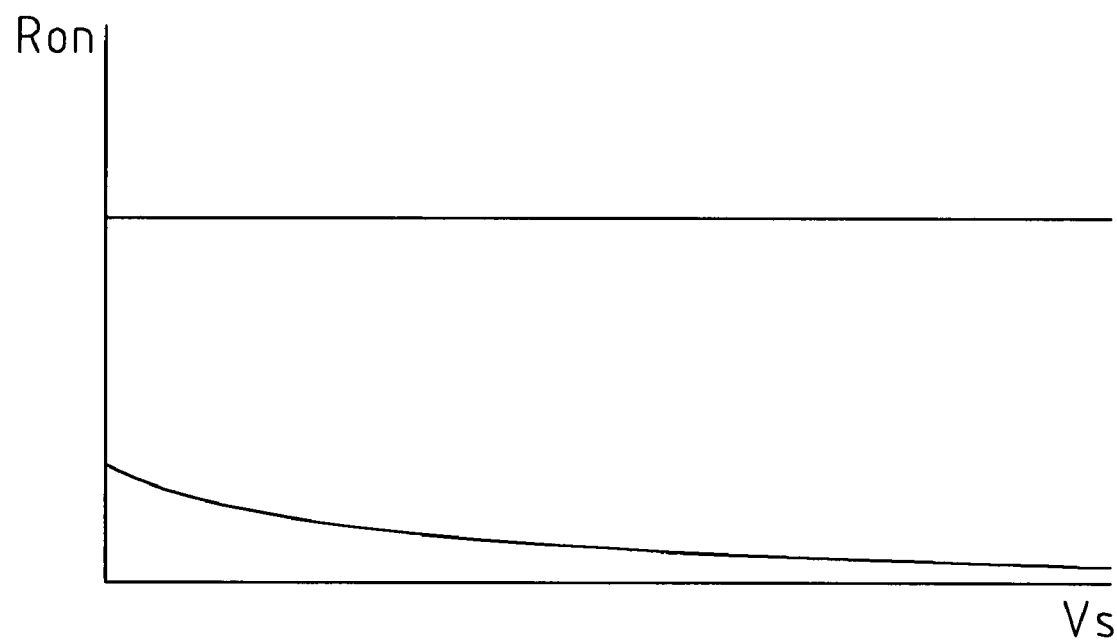
FIG. 7 is a graph illustrating the improved $R_{on}$ performance of the switching circuit of FIG. 3 compared with the prior art PMOS switch.

The graph of FIG. 7 shows the improved performance of the switching circuit 1 compared to the prior art PMOS switch. The $R_{on}$ of the switching circuit 1 remains constant at twice the value of the sense resistor 7. Thus, the output of the switching circuit 40 substantially follows the input.

Figure 8:
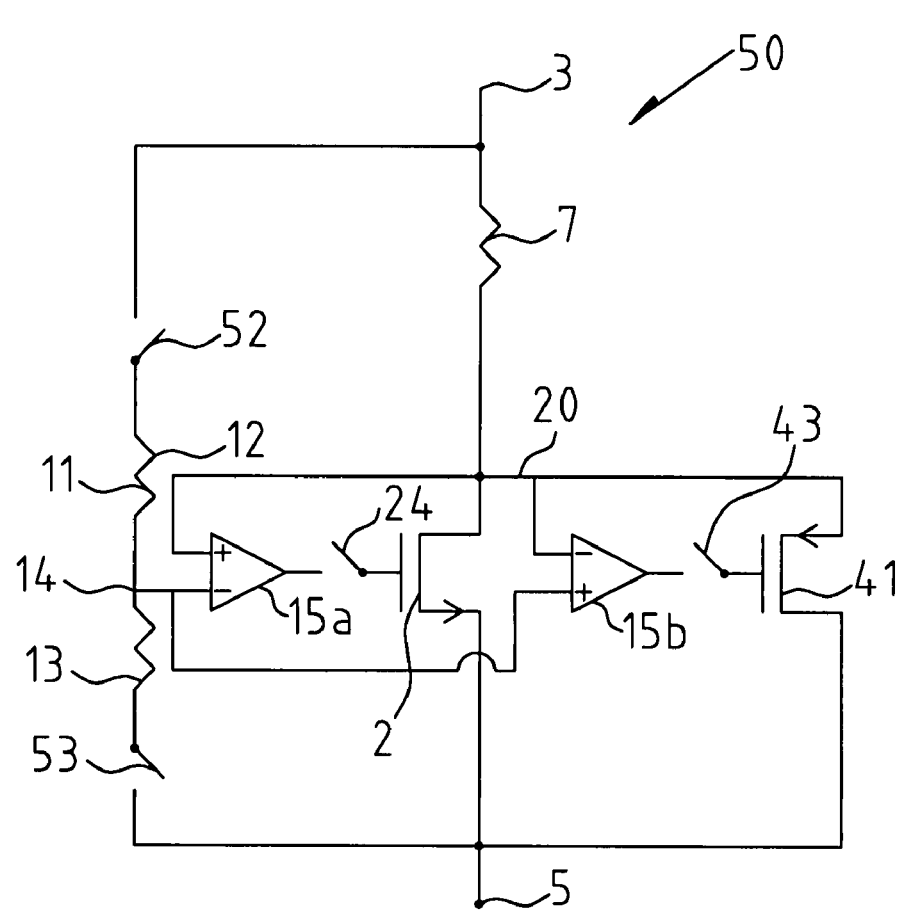
FIG. 8 is schematic circuit diagram of a switching circuit according to a further embodiment.

Referring now to FIG. 8, there is illustrated another switching circuit 50 which is similar to the switching circuit 1 and the switching circuit 40 and like components are indicated by the same reference numerals. The switching circuit 50 is a combination of the NMOS switching circuit 1 in parallel with the PMOS switching circuit 40 and is designed to operate like a CMOS switch. The first control switch 24 and the second control switch 43 are controlled by a controller such that the NMOS transistor 2 and the PMOS transistor 41 are turned on and off simultaneously in a manner which will be well known to those skilled in the art so that the switching circuit 50 operates similarly to a conventional CMOS switch. A first isolation switch 52 is provided between the first resistor 12 and the input node 3, and a second isolation switch 53 is provided between the second resistor 13 and the output node 5 which are opened when the NMOS transistor 2 and the PMOS transistor 41 are turned off thereby preventing leakage current from the input node 3 to the output node 5.

The graph of FIG. 10 shows the improved performance of the switching circuit 50 compared to the prior art CMOS switch. The $R_{on}$ of the switching circuit 50 remains constant at twice the value of the sense resistor 7. Thus, the output of the switching circuit 50 will substantially follow the input.

It will be understood that what has been described herein are illustrative circuit schematics provided in accordance with the teachings of the invention to assist in an understanding of the invention. Such exemplary arrangements are not to be construed as limiting the invention in any way, except as may be deemed necessary in the light of the appended claims. For example, while the switch has been described as being a CMOS device, it will be appreciated by those skilled in the art that alternative semiconductor devices may be used. Additionally, while the sense resistor has been shown coupled to the input node, it will be appreciated that it could also be coupled the output node. Furthermore, while the switching circuit has been described with reference to employing a resistor divider and an op-amp it will be appreciated that a variety of different techniques may be employed in their place including the use of an Analog-to-Digital converter providing a digital sense signal, with digital compensation circuitry modifying a gate driver signal to maintain a constant on-resistance. Components described with reference to one Figure may be interchanged with those of other circuits without departing from the spirit and scope of the invention.

The words comprises/comprising when used in this specification are to specify the presence of stated features, integers, steps or components but does not preclude the presence or addition of one or more other features, integers, steps, components or groups thereof.

The invention claimed is:

1. A switching circuit for switchably connecting an input node and an output node, the switching circuit comprising:
   a switch operable to switchably connect the input node to the output node in response to a switching signal, the switch comprising an NMOS transistor coupled in parallel to a PMOS transistor;
   a sensor for sensing the voltage between the input and output nodes and providing a sense signal in response thereto; and
   a driver coupled to the sensor, the driver adjusting the switching signal in response to the sense signal.

2. A switching circuit as claimed in claim 1, wherein the sensor comprises a resistor divider connected between said input node and said output node.

3. A switching circuit as claimed in claim 1, wherein the driver comprises an operational amplifier.

4. A switching circuit as claimed in claim 1, wherein the switching circuit further comprises a sense resistor coupled between the switch and one of the input and output nodes, wherein the driver is adapted to adjust the switching signal to maintain the switch resistance constant in proportion to the sense resistor.

5. A switching circuit as claimed in claim 1, wherein the driver comprises a first operational amplifier for driving the NMOS transistor.

6. A switching circuit as claimed in claim 5, wherein a second operational amplifier drives the PMOS transistor.

7. A switching circuit as claimed in claim 5, further comprising a first control switch for switchably connecting the switching signal to the NMOS transistor.

8. A switching circuit as claimed in claim 7, wherein the first control switch is configured to selectably switch the gate of the first transistor from the output of the first operational amplifier and a voltage source suitable for turning off the NMOS transistor.

9. A switching circuit as claimed in claim 8, wherein the first control switch is located intermediate the output of the first operational amplifier and a gate of the NMOS transistor.

10. A switching circuit as claimed in claim 6, further comprising a second control switch which is selectively controlled for electrically isolating the PMOS transistor from the second operational amplifier.

11. A switching circuit as claimed in claim 10, wherein the second control switch is selectable between an output of the second operational amplifier and a voltage source suitable for turning off the PMOS transistor.

12. A switching circuit as claimed in claim 11, wherein the second control switch is located intermediate the output of the second operational amplifier and a gate of the PMOS transistor.

13. A switching circuit as claimed in claim 4, wherein the resistor divider comprises a first resistor and a second resistor in series between the input node and output node, wherein the first and second resistors are scaled relative to each other for determining a proportionality constant (K) for fixing the on-resistance of the switch proportional to the sense resistor.

14. A switching circuit as claimed in claim 13, further comprising a first isolation switch for electrically isolating the first resistor from the input node.

15. A switching circuit as claimed in claim 14, further comprising a second isolation switch for electrically isolating the second resistor from the output node.

16. A method of switchably connecting an input node and an output node, the method comprising the steps of:
   (a) providing a switch operable in response to a switching signal, the switch comprising an NMOS transistor coupled in parallel to a PMOS transistor;
   (b) sensing the voltage at the input and output nodes to provide a sense signal therefrom; and
   (c) adjusting the switching signal in response to the sense signal to maintain a constant switch resistance.

17. A switching circuit for switchably connecting an input node and an output node, the switching circuit comprising:
   a switch operable in response to a drive signal; the switch comprises an NMOS transistor coupled in parallel to a PMOS transistor,
   a sense resistor placed in series with said switch between said input node and output node,
   a potentiometer connected across said input node and output node generating a sense output voltage proportional to said voltage across said input and output nodes, and
   a driver responsive to said potentiometer voltage said driver providing the drive signal to said switch.

* * * * *